US012460299B2

(12) United States Patent
Rye et al.

(10) Patent No.: US 12,460,299 B2
(45) Date of Patent: Nov. 4, 2025

(54) WET CLEAN SPRAY PROCESS CHAMBER FOR SUBSTRATES

(71) Applicant: Applied Materials, Inc., Santa Clara, CA (US)

(72) Inventors: Jason Rye, Kalispell, MT (US); Nolan Layne Zimmerman, Kalispell, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 452 days.

(21) Appl. No.: 17/880,212

(22) Filed: Aug. 3, 2022

(65) Prior Publication Data

US 2023/0040192 A1    Feb. 9, 2023

Related U.S. Application Data

(60) Provisional application No. 63/229,922, filed on Aug. 5, 2021.

(51) Int. Cl.
*H01L 21/67* (2006.01)
*C23C 16/44* (2006.01)
(Continued)

(52) U.S. Cl.
CPC ...... *C23C 16/4584* (2013.01); *C23C 16/4408* (2013.01); *H01L 21/67051* (2013.01); *H01L 21/68785* (2013.01)

(58) Field of Classification Search
CPC ........... H01L 21/6704; H01L 21/67051; H01L 21/67063; H01L 21/6708; H01L 21/68714;
(Continued)

(56) References Cited

U.S. PATENT DOCUMENTS

| 7,694,688 B2 | 4/2010 | Lester et al. |
| 2002/0051644 A1* | 5/2002 | Sugimoto ......... H01L 21/67028 396/564 |

(Continued)

FOREIGN PATENT DOCUMENTS

| CN | 111633531 A | 9/2020 |
| CN | 112735988 A | 4/2021 |

(Continued)

OTHER PUBLICATIONS

Machine Translation of Nakanishi, TWI664029B, Feb. 2016. (Year: 2016).*

(Continued)

*Primary Examiner* — David G Cormier
(74) *Attorney, Agent, or Firm* — Moser Taboada

(57) ABSTRACT

Embodiments of wet clean chambers are provided herein. In some embodiments, a wet clean chamber includes: a deck plate; a substrate support that is rotatable and configured to support a substrate; a rotor disposed about and configured to rotate with the substrate support, wherein the rotor includes an upper fluid collection region disposed radially outward of the substrate support in position to collect fluid leaving the substrate support during processing, and wherein the upper fluid collection region includes a plurality of drain openings along a radially outward perimeter of a bottom of the upper fluid collection region; a stationary housing surrounding the rotor and having a lower fluid collection region disposed beneath the drain openings of the rotor; and one or more fluid delivery arms coupled to the deck plate and configured to deliver fluid to the substrate.

19 Claims, 6 Drawing Sheets

(51) Int. Cl.
*C23C 16/458* (2006.01)
*H01L 21/687* (2006.01)

(58) Field of Classification Search
CPC ......... H01L 21/68728; H01L 21/68742; H01L 21/6875; H01L 21/67155; H01L 21/67161; H01L 21/67173; H01L 21/67236
See application file for complete search history.

(56) References Cited

U.S. PATENT DOCUMENTS

| | | | |
|---|---|---|---|
| 2003/0176029 A1* | 9/2003 | Sugimoto | H01L 21/67051 438/200 |
| 2003/0205324 A1* | 11/2003 | Keeton | H01L 21/6875 427/398.1 |
| 2004/0159343 A1* | 8/2004 | Shimbara | H01L 21/68785 134/33 |
| 2006/0065286 A1 | 3/2006 | Rana et al. | |
| 2008/0073324 A1* | 3/2008 | Nogami | H01L 21/6838 156/345.37 |
| 2010/0130105 A1* | 5/2010 | Lee | H01L 21/6838 451/388 |
| 2011/0114120 A1 | 5/2011 | Nuch et al. | |
| 2012/0160277 A1 | 6/2012 | Higashijima | |
| 2016/0214148 A1* | 7/2016 | Okutani | H01L 21/67017 |
| 2016/0293471 A1* | 10/2016 | Shang | H01L 21/67051 |
| 2016/0322240 A1 | 11/2016 | Lee et al. | |
| 2017/0084470 A1 | 3/2017 | Suzuki et al. | |

FOREIGN PATENT DOCUMENTS

| | | | | |
|---|---|---|---|---|
| EP | 1879216 A1 * | 1/2008 | | G03F 7/162 |
| JP | 2003/059894 A | 2/2003 | | |
| KR | 10-2015-0010630 A | 1/2015 | | |

OTHER PUBLICATIONS

PCT International Search Report and Written Opinion for PCT/US2022/074562 dated Nov. 18, 2022.
European Search Report for EP 22854110, dated Jul. 3, 2025.

* cited by examiner

WET CLEAN SPRAY PROCESS CHAMBER FOR SUBSTRATES

CROSS-REFERENCE TO RELATED APPLICATIONS

This application claims benefit of U.S. provisional patent application Ser. No. 63/229,922, filed Aug. 5, 2021, which is herein incorporated by reference in its entirety.

FIELD

Embodiments of the present disclosure generally relate to a substrate processing equipment, and more specifically, wet clean chambers for substrates.

BACKGROUND

Microelectronic devices are generally formed on a semiconductor wafer or other type substrate or workpiece. In a typical manufacturing process, one or more thin layers are formed on a wafer to produce microelectronic devices and/or to provide conducting lines between devices. During the formation of microelectronic devices, the substrate or workpiece may need to be cleaned between or after processing steps. However, the inventors have observed that conventional wet clean chambers do not provide adequate splashing mitigation, reducing the efficiency and effectiveness of the wet clean chamber.

Accordingly, the inventors have provided improved wet clean chambers for cleaning substrates.

SUMMARY

Embodiments of wet clean chambers are provided herein. In some embodiments, a wet clean chamber includes: a deck plate; a substrate support that is rotatable and configured to support a substrate; a rotor disposed about and configured to rotate with the substrate support, wherein the rotor includes an upper fluid collection region disposed radially outward of the substrate support in position to collect fluid leaving the substrate support during processing, and wherein the upper fluid collection region includes a plurality of drain openings along a radially outward perimeter of a bottom of the upper fluid collection region; a stationary housing surrounding the rotor and having a lower fluid collection region disposed beneath the drain openings of the rotor; and one or more fluid delivery arms coupled to the deck plate and configured to deliver fluid to the substrate.

In some embodiments, a wet clean chamber includes: a substrate support that is rotatable and configured to support a substrate in a support plane; a rotor disposed about and configured to rotate with the substrate support, wherein the rotor includes an upper fluid collection region disposed radially outward of the substrate support in position to collect fluid leaving the substrate support during processing, and wherein the upper fluid collection region includes a plurality of drain openings along a radially outward perimeter of a bottom of the upper fluid collection region; and a stationary housing surrounding the rotor and having a lower fluid collection region disposed beneath the drain openings of the rotor.

In some embodiments, a multi-chamber processing tool, includes: a factory interface having one or more loadports; a transfer chamber coupled to the factory interface; and a wet clean chamber coupled to the transfer chamber, the wet clean chamber, comprising: a substrate support that is rotatable and configured to support a substrate in a support plane; a rotor disposed about and configured to rotate with the substrate support, wherein the rotor includes an upper fluid collection region disposed radially outward of the substrate support in position to collect fluid leaving the substrate support during processing, and wherein the upper fluid collection region includes a plurality of drain openings; and a stationary housing surrounding the rotor and having a lower fluid collection region disposed beneath the drain openings of the rotor.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
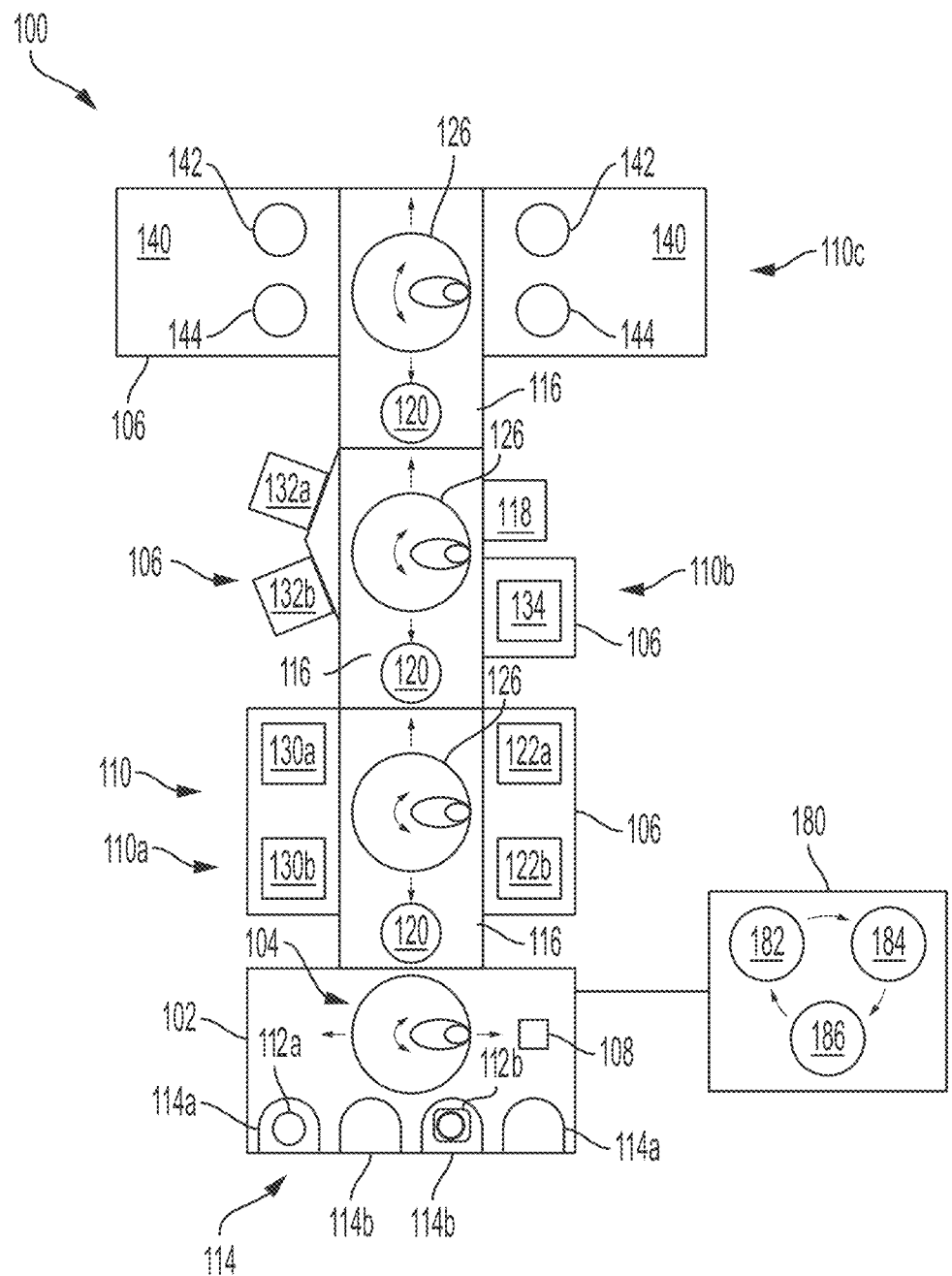
FIG. 1 depicts a schematic top view of a multi-chamber processing tool in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of wet clean process chambers are provided herein. The wet clean process chambers generally include a rotating portion, or rotor, and a stationary portion, or stationary housing. A substrate support is disposed in the rotor and rotates with the rotor. The stationary housing generally surrounds the rotor. The rotor advantageously includes an upper fluid collection region radially outward of the substrate support to collect fluid leaving the rotor during processing. The upper fluid collection may be advantageously coupled to a low fluid collection region of the stationary housing to drain processing fluids from the substrate support and the rotor. The stationary housing may include a cover that extends above the rotor to advantageously reduce or prevent splashing of fluids during processing. In some embodiments, the wet clean process chamber can be advantageously used to clean film frames used in packaging applications. In some embodiments, the wet clean process chamber can be advantageously used to clean other substrates, such as 300 mm wafers, or the like. In some embodiments, the wet clean process chamber can advantageously have a configuration that can be easily changed between a configuration for cleaning film frames and a configuration for cleaning other substrates with minimal maintenance, such as by replacement of a single subassembly.

FIG. 1 depicts a schematic top view of a multi-chamber processing tool in accordance with at least some embodiments of the present disclosure. The multi-chamber process tool 100 generally includes an equipment front end module (EFEM) 102 and a plurality of automation modules 110 that are serially coupled to the EFEM 102. The plurality of automation modules 110 are configured to shuttle one or more types of substrates 112 from the EFEM 102 through the multi-chamber process tool 100 and perform one or more processing steps to the one or more types of substrates 112. Each of the plurality of automation modules 110 generally include a transfer chamber 116 and one or more process chambers 106 coupled to the transfer chamber 116 to perform the one or more processing steps. The plurality of automation modules 110 are coupled to each other via their respective transfer chamber 116 to advantageously provide modular expandability and customization of the multi-chamber process tool 100. As depicted in FIG. 1, the plurality of automation modules 110 comprise three automation modules, where a first automation module 110a is coupled to the EFEM 102, a second automation module 110b is coupled to the first automation module 110a, and a third automation module 110c is coupled to the second automation module 110b.

The EFEM 102 includes a plurality of loadports 114 for receiving one or more types of substrates 112. In some embodiments, the one or more types of substrates 112 include 200 mm wafers, 300 mm wafers, 450 mm wafers, tape frame substrates, carrier substrates, silicon substrates, glass substrates, or the like. In some embodiments, the plurality of loadports 114 include at least one of one or more first loadports 114a for receiving a first type of substrate 112a or one or more second loadports 114b for receiving a second type of substrate 112b. In some embodiments, the first type of substrates 112a have a different size than the second type of substrates 112b. In some embodiments, the second type of substrates 112b include tape frame substrates or carrier substrates. In some embodiments, the second type of substrates 112b include a plurality of chiplets disposed on a tape frame or carrier plate. In some embodiments, the second type of substrates 112b may hold different types and sizes of chiplets. As such, the one or more second loadports 114b may have different sizes or receiving surfaces configured to load the second type of substrates 112b having different sizes.

In some embodiments, the EFEM 102 includes a scanning station 108 having substrate ID readers for scanning the one or more types of substrates 112 for identifying information. In some embodiments, the substrate ID readers include a bar code reader or an optical character recognition (OCR) reader. The multi-chamber processing tool 100 is configured to use any identifying information from the one or more types of substrates 112 that are scanned to determine process steps based on the identifying information, for example, different process steps for the first type of substrates 112a and the second type of substrates 112b. In some embodiments, the scanning station 108 may also be configured for rotational movement to align the first type of substrates 112a or the second type of substrates 112b.

An EFEM robot 104 is disposed in the EFEM 102 and configured to transport the first type of substrates 112a and the second type of substrates 112b between the plurality of loadports 114 to the scanning station 108. The EFEM robot 104 may include substrate end effectors for handling the first type of substrates 112a and second end effectors for handling the second type of substrates 112b. The EFEM robot 104 may rotate or rotate and move linearly.

The one or more process chambers 106 may be sealingly engaged with the transfer chamber 116. The transfer chamber 116 generally operates at atmospheric pressure but may be configured to operate at vacuum pressure. For example, the transfer chamber 116 may be a non-vacuum chamber configured to operate at an atmospheric pressure of about 700 Torr or greater. Additionally, while the one or more process chambers 106 are generally depicted as orthogonal to the transfer chamber 116, the one or more process chambers 106 may be disposed at an angle with respect to the transfer chamber 116 or a combination of orthogonal and at an angle. For example, the second automation module 110b depicts a pair of the one or more process chambers 106 disposed at an angle with respect to the transfer chamber 116.

The transfer chamber 116 includes a buffer 120 configured to hold one or more first type of substrates 112a. In some embodiments, the buffer 120 is configured to hold one or more of the first type of substrates 112a and one or more of the second type of substrates 112b. The transfer chamber 116 includes a transfer robot 126 configured to transfer the first type of substrates 112a and the second type of substrates 112b between the buffer 120, the one or more process chambers 106, and a buffer disposed in an adjacent automation module of the plurality of automation modules 110. In some embodiments, the buffer 120 is disposed within the interior volume of the transfer chamber 116, advantageously reducing the footprint of the overall tool. In addition, the buffer 120 can be open to the interior volume of the transfer chamber 116 for ease of access by the transfer robot 126. The transfer chamber 116 may have one or more environmental controls. For example, a filtered airflow opening, humidity control, static control, temperature control, or pressure control.

The one or more process chambers 106 may include atmospheric chambers that are configured to operate under atmospheric pressure and vacuum chambers that are configured to operate under vacuum pressure. Examples of the atmospheric chambers may generally include wet clean chambers 122, radiation chambers 134, heating chambers, metrology chambers, bonding chambers 140, or the like. Examples of vacuum chambers may include plasma chambers. The types of atmospheric chambers discussed above may also be configured to operate under vacuum, if needed.

The wet clean chamber 122 is configured to perform a wet clean process to clean the one or more types of substrates 112 via a fluid, such as water. The wet clean chamber 122 may include a first wet clean chamber 122a for cleaning the first type of substrates 112a or a second wet clean chamber 122b for cleaning the second type of substrates 112b. The degas chamber 132 is configured to perform a degas process to remove moisture from the substrates 112. In some embodiments, the degas chamber 132 includes a first degas chamber 132a for the first type of substrates 112a and a second degas chamber 132b for the second type of substrates 112b. The plasma chamber 130 may be configured to perform an etch process to remove unwanted material, for example organic materials and oxides, from the first type of substrates 112a or the second type of substrates 112b. In some embodiments, the plasma chamber 130 includes a first plasma chamber 130a for the first type of substrates 112a and a second plasma chamber 130b for the second type of substrates 112b. In some embodiments, the plasma chamber 130 may be configured to perform a deposition process, for example, a physical vapor deposition process, a chemical vapor deposition process, or the like, to coat the first type of substrates 112a or the second type of substrates 112b with a desired layer of material.

The radiation chamber 134 is configured to perform a radiation process on the second type of substrates 112b to reduce adhesion between a plurality of chiplets and a backing tape. For example, the radiation chamber 134 may be an ultraviolet radiation chamber configured to direct ultraviolet radiation at the backing tape or a heating chamber configured to heat the backing tape. The reduced adhesion between the plurality of chiplets and the backing tape facilitates easier removal of the plurality of chiplets from the second type of substrates 112b. The bonder chamber 140 is configured to transfer and bond at least a portion of the plurality of chiplets 212 to one of the first type of substrates 112a. The bonder chamber 140 generally includes a first support 142 to support one of the first type of substrates 112a and a second support 144 to support one of the second type of substrates 112b.

In the illustrative example of FIG. 1, the first automation module 110a includes a first plasma chamber 130a and a second plasma chamber 130b on a first side of the first automation module 110a. In some embodiments, the first automation module 110a includes a first wet clean chamber 122a and a second wet clean chamber 122b on a second side of the first automation module 110a opposite the first side. In some embodiments, the second automation module includes a radiation chamber 134 and at least one of a plasma chamber 130 or a degas chamber 132. In some embodiments, a last automation module of the plurality of automation modules 110, for example the third automation module 110c of FIG. 1, includes one or more bonder chambers 140 (two shown in FIG. 1). In some embodiments, any of the plurality of automation modules 110 include a metrology chamber 118 configured to take measurements of the one or more types of substrates 112. In FIG. 1, the metrology chamber 118 is shown as a part of the second automation module 110b coupled to the transfer chamber 116 of the second automation module 110b. However, the metrology chamber 118 may be coupled to any transfer chamber 116 or within the transfer chamber 116.

A controller 180 controls the operation of any of the multi-chamber processing tools described herein, including the multi-chamber processing tool 100. The controller 180 may use a direct control of the multi-chamber processing tool 100, or alternatively, by controlling the computers (or controllers) associated with the multi-chamber processing tool 100. In operation, the controller 180 enables data collection and feedback from the multi-chamber processing tool 100 to optimize performance of the multi-chamber processing tool 100. The controller 180 generally includes a Central Processing Unit (CPU) 182, a memory 184, and a support circuit 186. The CPU 182 may be any form of a general-purpose computer processor that can be used in an industrial setting. The support circuit 186 is conventionally coupled to the CPU 182 and may comprise a cache, clock circuits, input/output subsystems, power supplies, and the like. Software routines, such as a method as described below may be stored in the memory 184 and, when executed by the CPU 182, transform the CPU 182 into a specific purpose computer (controller 180). The software routines may also be stored and/or executed by a second controller (not shown) that is located remotely from the multi-chamber processing tool 100.

The memory 184 is in the form of computer-readable storage media that contains instructions, when executed by the CPU 182, to facilitate the operation of the semiconductor processes and equipment. The instructions in the memory 184 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
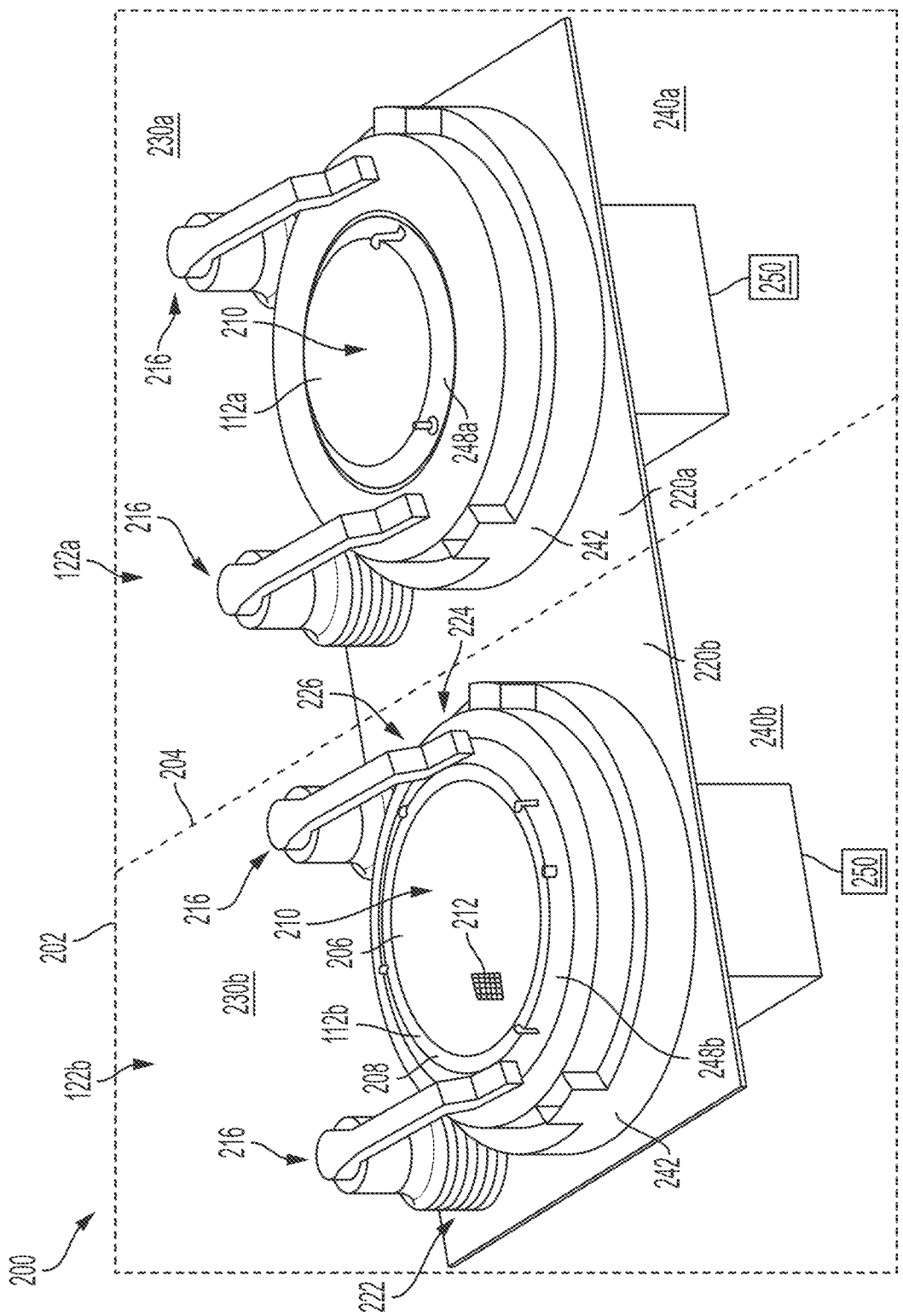
FIG. 2 depicts a schematic view of a twin wet clean chamber in accordance with at least some embodiments of the present disclosure.

The wet clean chamber 122 may be a standalone chamber, or as shown in FIG. 2, comprise a twin wet clean chamber 200. FIG. 2 depicts a schematic view of a twin wet clean chamber 200 in accordance with at least some embodiments of the present disclosure. In some embodiments, the twin wet clean chamber 200 comprises one of the first wet clean chamber 122a and one of the second wet clean chamber 122b. In some embodiments, the first wet clean chamber 122a is configured to process the first type of substrate 112a and the second wet clean chamber 122b is configured to process the second type of substrate 112b. The second type of substrate 112b may include a tape frame 208 surrounding a plurality of chiplets 212, or dies, attached to a backing tape 206. The wet dean chamber 122 (e.g., the first wet clean chamber 122a, the second wet clean chamber 122b) is generally 'open' on top, so that an upper surface 210, or face, of a substrate 112 being processed is fully exposed to atmosphere. The first wet dean chamber 122a and the second wet clean chamber 122b may be disposed in an enclosure 202. In some embodiments, a separation wall 204 is disposed therebetween to separate the first wet clean chamber 122a from the second wet clean chamber 122b. The enclosure 202 may include transfer slots (not shown) to transfer substrates 112 into and out of the respective wet clean chambers 122a, 122b.

Each of the first wet clean chamber 122a and the second wet clean chamber 122b include a respective deck plate, for example, deck plate 220a and deck plate 220b to separate a processing region 230a, 230b above the deck plate 220a, 220b and an exhaust region 240a, 240b below the deck plate 220a, 220b. In some embodiments, a pressure in the processing region 230a, 230b is higher than a pressure in the exhaust region 240a, 240b to form a pressure gradient that encourages fluid flow from the processing region 230a, 230b to the exhaust region 240a, 240b.

The upper surface 210 the substrate 112, for example, an upper surface of the plurality of chiplets 212 or upper surface of substrate 112a in each wet clean chamber 122 is processed via one or more fluid delivery arms 216. The one or more fluid delivery arms can delivery process fluids or gases to the substrate 112. In some embodiments, the one or more fluid delivery arms 216 are coupled to the deck plate 220a, 220b. In some embodiments, the one or more fluid delivery arms 216 are configured for rotational and vertical movement with respect to the deck plate 220a, 220b to clean an entire width of the upper surface 210 of the substrate 112. In some embodiments, each of the one or more fluid delivery arms 216 include a bellows assembly 222 to facilitate vertical movement of the one or more fluid delivery arms 216 while providing a seal between the one or more fluid delivery arms 216 and the deck plate 220a, 220b.

In some embodiments, the one or more fluid delivery arms 216 comprise a first arm configured to deliver a first fluid and a second arm configured to deliver a second fluid. For example, the first fluid may be water, such as deionized water. In some embodiments, the second fluid may be a mixture comprising an acid, such as sulfuric acid, dilute hydrofluoric acid, peroxide, or the like. In some embodiments, a single one of the one or more fluid delivery arms 216 may be configured to delivery the first fluid and the second fluid. The one or more fluid delivery arms 216 include a nozzle end 224 having a suitable nozzle for delivering or spraying the first fluid or second fluid. In some embodiments, the one or more fluid delivery arms 216 advantageously include a downward bend 226 that extends the nozzle end 224 vertically closer to the substrate 112 to enhance cleaning and reduce splashing of the fluids delivered to the substrate 112.

The wet clean chamber 122 generally includes a stationary housing 242 and a substrate support 248a, 248b configured to support the substrate 112a, 112b along a support plane. The substrate support 248a, 248b is disposed in the stationary housing 242 and rotatable with respect to the stationary housing 242. The substrate support 248a, 248b is coupled to a motor 250 configured to rotate the substrate support 248a, 248b to perform a wet clean or final rinse-dry process of the substrate 112a, 112b.

Figure 3:
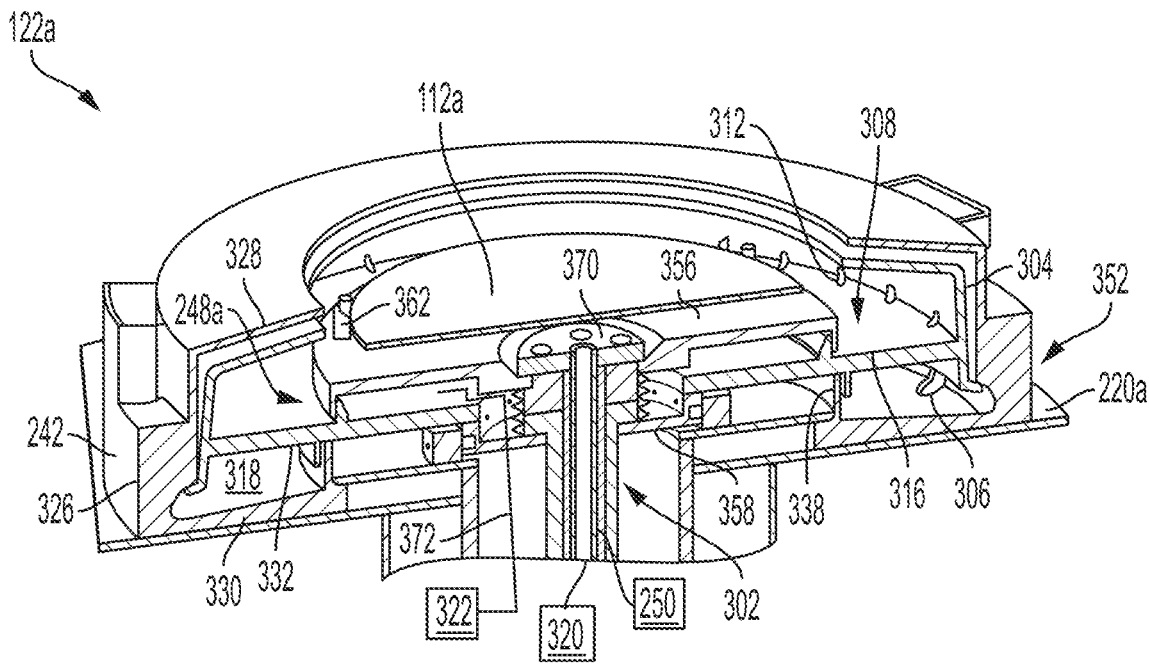
FIG. 3 depicts an isometric cross-sectional view of a wet clean chamber in accordance with at least some embodiments of the present disclosure.

FIG. 3 depicts an isometric cross-sectional view of a wet clean chamber 122a in accordance with at least some embodiments of the present disclosure. The foregoing discussion with respect to wet clean chamber 122a may be applied to wet clean chamber 122b, with the wet clean chamber 122b having a substrate support 248b configured to process the second type of substrate 112b. The wet clean chamber 122a includes a rotor 304 disposed about and configured to rotate with the substrate support 248a. The rotor 304 includes an upper fluid collection region 308 disposed radially outward of the substrate support 248a in position to collect fluid leaving the rotating substrate support 248a during processing. The rotor 304 includes a plurality of drain openings 312 along a radially outward perimeter of a bottom 316 of the upper fluid collection region 308. In some embodiments, the plurality of drain openings 312 in the rotor 304 comprise about 30 to about 90 openings.

The stationary housing 242 surrounds the rotor 304 and has a lower fluid collection region 318 disposed beneath the plurality of drain openings 312 of the rotor 304. The stationary housing 242 includes one or more exhaust ports 306 fluidly coupled to the lower fluid collection region 318 to exhaust processing fluids to a region below the deck plate 220a. In some embodiments, the stationary housing 242 includes a body 326 and a cover 328 extending upward and radially inward from the body 326. In some embodiments, the cover 328 is disposed above the upper fluid collection region 308.

In some embodiments, a lower portion 352 of the stationary housing 242 includes a lower lip 330 that extends radially inward from the body 326. In some embodiments, an upper surface of the lower lip 330 defines a bottom of the lower fluid collection region 318. In some embodiments, the upper surface of the lower lip 330 is sloped downward and radially outward to urge process fluid and byproducts radially outward to the one or more exhaust ports 306. In some embodiments, the stationary housing 242 includes an inner lip 338 that extends upwards from the lower lip 330 to define a radially inner surface of the lower fluid collection region 318. In some embodiments, the inner lip 338 extends from a radially inner portion of the lower lip 330. In some embodiments, an upper surface of the lower fluid collection region 318 may be defined by a lower surface 332 of the rotor 304.

The substrate support 248a is configured to rotate with the rotor 304. In some embodiments, the substrate support 248a includes a support plate 356 coupled to a support shaft 302 of the substrate support 248a. In some embodiments, the support plate 356 is coupled to the support shaft 302 via a top plate 370 that couples or clamps the support plate 356 to the support shaft 302. In some embodiments, the substrate support 248a is coupled to the rotor 304 via an upper flange 358 of the support shaft 302. The support shaft 302 may provide a conduit to provide, for example, fluids such as backside gases, deionized water, or the like, to clean a backside of the substrate 112a. In some embodiments, the support shaft 302 is coupled to a backside fluid source 320 having a liquid, a gas, or a mixture comprising liquid and gas. In some embodiments, the backside fluid source 320 include helium, argon, deionized water, or the like. In some embodiments, a gas purge line 372 extends from a purge gas source 322 to a region between the support plate 356 and the rotor 304 radially inward of the upper fluid collection region 308.

The support plate 356 includes one or more substrate holders 362 configured to hold or support the substrate 112a while the substrate 112a spins during processing. The one or more substrate holders 362 may be configured to raise the substrate 112a along a support plane above an upper surface of the support plate 356. In some embodiments, the motor 250 is configured to raise or lower the substrate support 248a to aid in the transfer of the substrate 112a and the processing of the substrate 112a.

Figure 4:
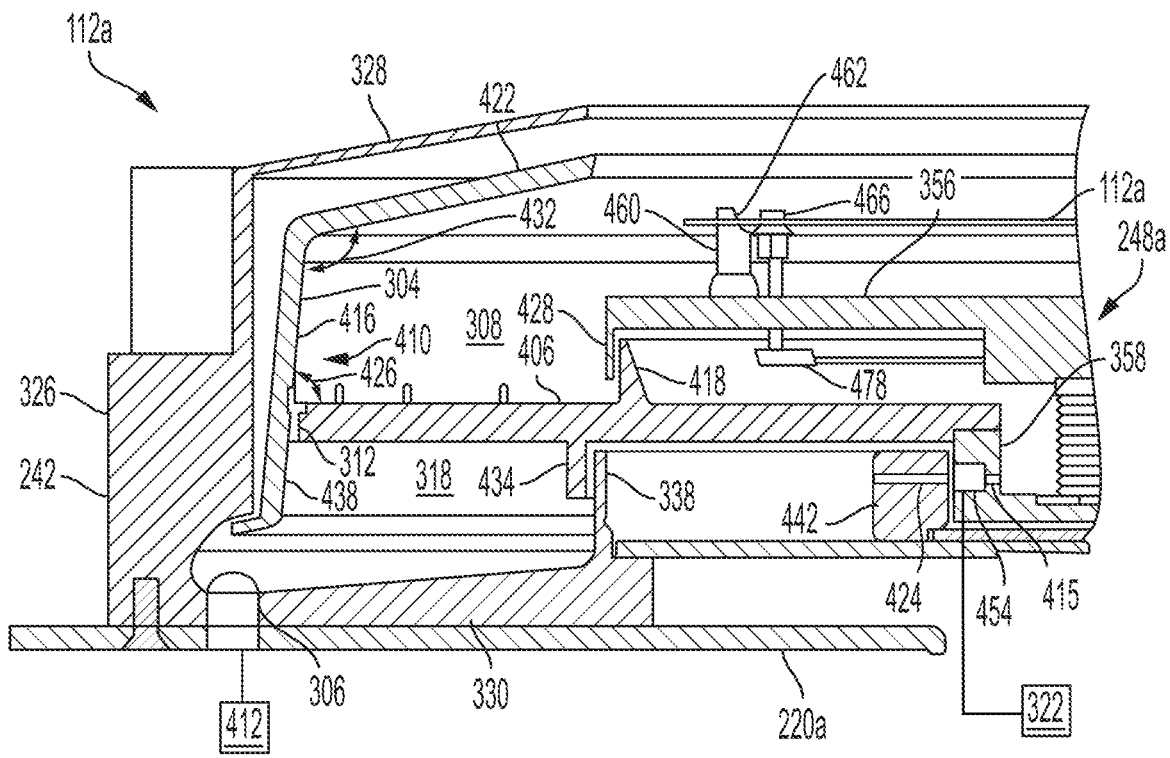
FIG. 4 depicts a cross-sectional view of a portion of a wet clean chamber in accordance with at least some embodiments of the present disclosure.

FIG. 4 depicts a cross-sectional view of a portion of a wet clean chamber 122a in accordance with at least some embodiments of the present disclosure. In some embodiments, the rotor 304 comprises an annular base plate 406 and an outer wall 410 extending upward and radially inward from an outer perimeter of the annular base plate 406. In some embodiments, the annular base plate 406 and the outer wall 410 define lower and outer surfaces, respectively, of the upper fluid collection region 308. In some embodiments, the outer wall 410 of the rotor 304 includes a first wall 416 extending upward and radially inward at a first angle 426 from the annular base plate 406. In some embodiments, the outer wall 410 includes a second wall 422 extending upward and radially inward from the first wall 416 at a second angle 432 greater than the first angle 426.

The first wall 416 that is angled and configured to spin as a same rotational speed as the support plate 356 advantageously reduces splashing, urges fluid towards the plurality of drain openings 312, and reduces collection of stagnant fluid in the upper fluid collection region 308. The second wall 422 may correspond with the cover 328 of the stationary housing 242. In some embodiments, the cover 328 and the second wall 422 are configured to reduce splashing of processing fluids out of the "open" top of the wet clean chamber 122a. The cover 328 and the second wall 422 also advantageously mitigate air disturbances above the rotor 304 that might cause substrate particle issues. The lower fluid collection region 318 may be coupled to exhaust 412 via the one or more exhaust ports 306.

In some embodiments, the rotor 304 includes a first annular lip 418 extending upward from the annular base plate 406. In some embodiments, the substrate support 248a includes an outer annular lip 428 that extends downward from and outer edge of the support plate 356 of the substrate support 248a and surrounds the first annular lip 418 of the rotor 304. In some embodiments, the outer annular lip 428 and the first annular lip 418 form a tortuous path between the support plate 356 and the rotor 304 to reduce or prevent fluid or fluid vapors from corroding critical metal components beneath the support plate 356. The tortuous path also advantageously helps contain purge gas from the purge gas source 322 to a region radially inward of the outer annular lip 428 and reduce or prevent purge gas from entering the upper fluid collection region 308.

In some embodiments, the rotor 304 includes a second annular lip 434 extending downward from the annular base plate 406 and surrounds the inner lip 338 of the stationary housing 242. In some embodiments, the outer wall 410 includes a third wall 438 that extends downward and radially outward from the annular base plate 406. In some embodiments, the third wall 438, the annular base plate 406, and the second annular lip 434 define an upper portion of the lower fluid collection region 318. The second annular lip 434 and the inner lip 338 advantageously contain purge gas to a region radially inward of the second annular lip 434 and reduce or prevent purge gas from the purge gas source 322 from entering the lower fluid collection region 318.

In some embodiments, the one or more substrate holders 362 include one or more support fingers 460 having a beveled surface 462 to support an outer surface of the substrate 112a and a lower outer surface of the substrate 112a. In some embodiments, the one or more substrate holders 362 include one or more standoffs 466 for retaining the substrate 112a. The one or more standoffs 466 may be coupled to a biasing member 478 disposed below the support plate 356 that urges the one or more standoffs 466 radially inward against an outer sidewall of the substrate 112a.

In some embodiments, the purge gas source 322 is fluidly coupled to an annular channel 454 of the upper flange 358. The annular channel 454 is configured to distribute the purge gas to at least one of a region radially inward of the upper flange 358 and a region radially outward of the upper flange 358. In some embodiments, the annular channel 454 extends radially inward from an outer surface of the upper flange 358. In some embodiments, the upper flange 358 may include a plurality of gas distribution openings 415 extending from the annular channel 454 to an inner surface of the upper flange 358 to distribute purge gas to the region between the support plate 356 and the rotor 304 radially inward of the upper fluid collection region 308.

In some embodiments, a purge ring 442 may be disposed about the upper flange 358. In some embodiments, the purge ring 442 includes a plurality of second gas distribution openings 424 extending from an inner surface of the purge ring 442 to an outer surface of the purge ring 442 and fluidly coupled to the annular channel 454 to distribute purge gas from the annular channel 454 to a region radially outward of the purge ring 442 and below the annular base plate 406. In some embodiments, the upper flange 358 rotates with the rotor 304 and the purge ring 442 is stationary. In some embodiments, there is a gap between the upper flange 358 and the inner surface of the purge ring 442 to prevent rubbing therebetween when the upper flange 358 rotates with respect to the purge ring 442.

Figure 5:
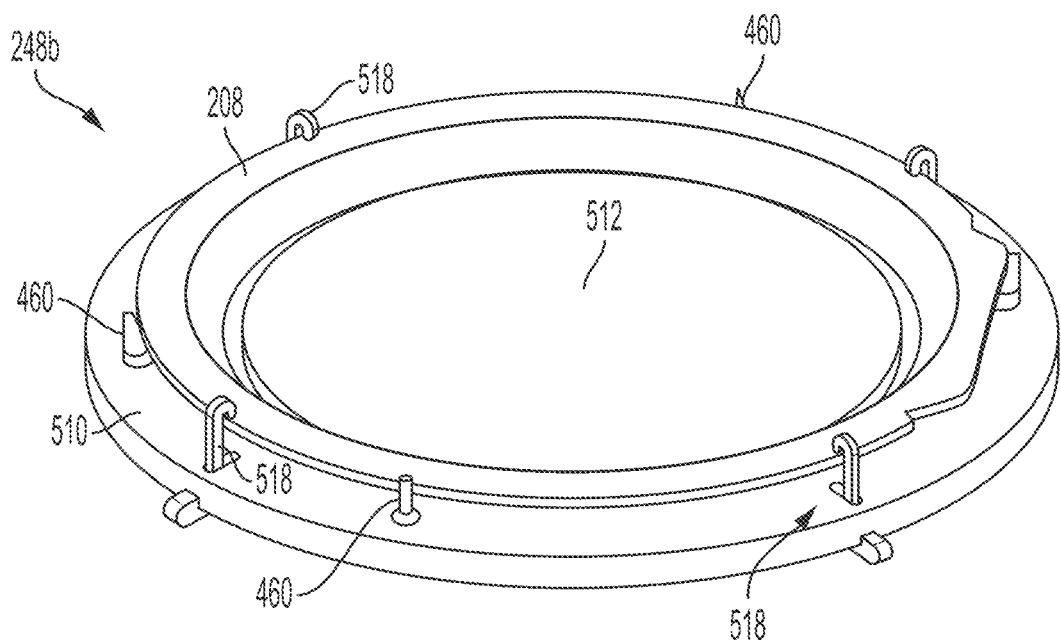
FIG. 5 depicts a top isometric view of a substrate support in accordance with a least some embodiments of the present disclosure.
Figure 6:
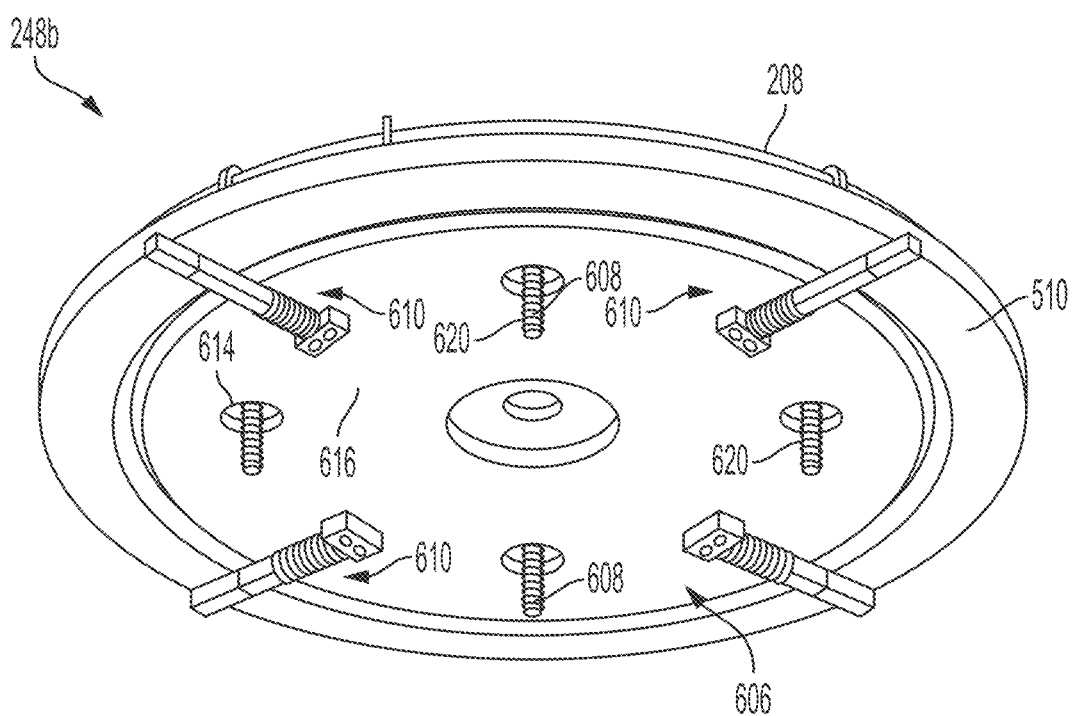
FIG. 6 depicts a bottom isometric view of a substrate support in accordance with at least some embodiments of the present disclosure.

FIG. 5 depicts a top isometric view of a substrate support in accordance with a least some embodiments of the present disclosure. FIG. 6 depicts a bottom isometric view of a substrate support in accordance with at least some embodiments of the present disclosure. In some embodiments, the substrate support 248b is configured to support a second type of substrate 112b. In some embodiments, the substrate support 248b comprises a base plate 510 and a support plate 512 disposed above the base plate 510. FIG. 5 depicts a tape frame 208 without the backing tape 206 for ease of view of the support plate 512. The support plate 512 is configured to be raised with respect to the base plate 510. When raised, the support plate 512 pushing up against the backing tape 206 prevents the backing tape 206 from sagging and makes the backing tape 206 more taut, advantageously enhancing cleaning and reducing or preventing the backing tape 206 from vibrating and generating particles when an upper surface of the second type of substrate 112b is processed (front-side processing).

In some embodiments, the one or more substrate holders 362 comprise one or more hook fingers 518. In some embodiments, the one or more hook fingers 518 are coupled to corresponding ones of a spring mechanism 610 configured to rotate the one or more hook fingers 518 to selectively clamp and unclamp the second type of substrate 112b from the substrate support 248b. In some embodiments, the one or more hook fingers 518 extend through the base plate 510 and are coupled to the spring mechanism 610 coupled to or otherwise disposed on a lower surface of 616 of the base plate 510. In some embodiments, the one or more hook fingers 518 have a "J"-shape. The base plate 510 may include a central recess 606 on the lower surface 616. In some embodiments, the support plate 512 is coupled to a plurality of posts 608 that extend through openings 614 in the base plate 510. In some embodiments, a biasing member 620 is disposed about each of the plurality of posts 608 to bias the support plate 512 against another chamber component, for example, the rotor 304 (see FIG. 7) to raise the support plate 512 with respect to the base plate 510.

Figure 7:
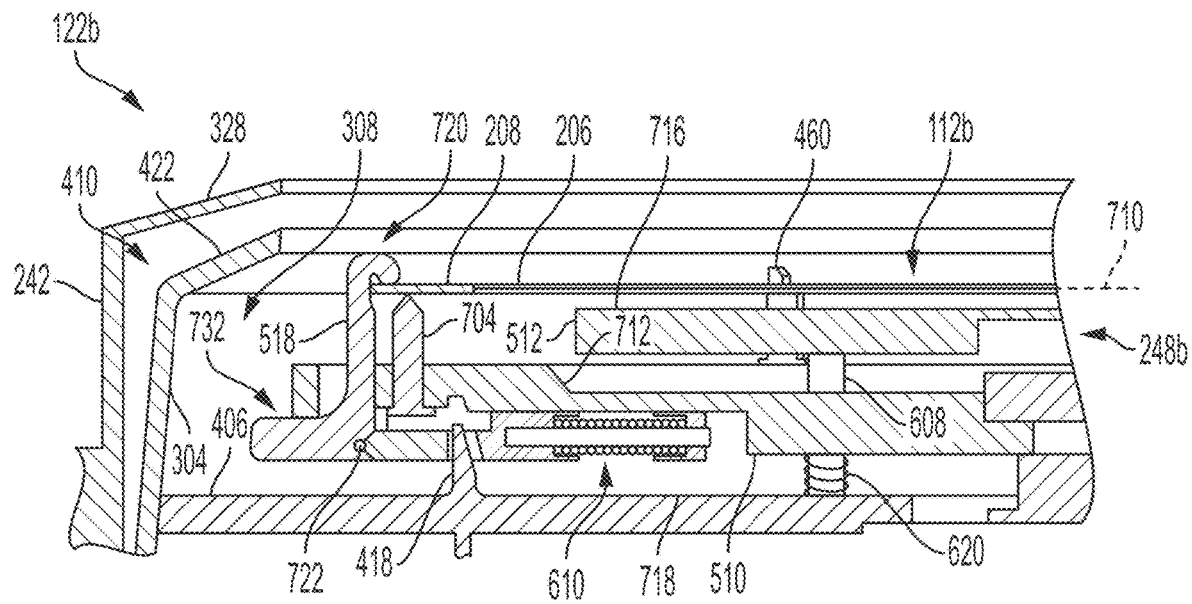
FIG. 7 depicts a cross-sectional view of a portion of a wet clean chamber in a back-side processing position in accordance with at least some embodiments of the present disclosure.
Figure 8:
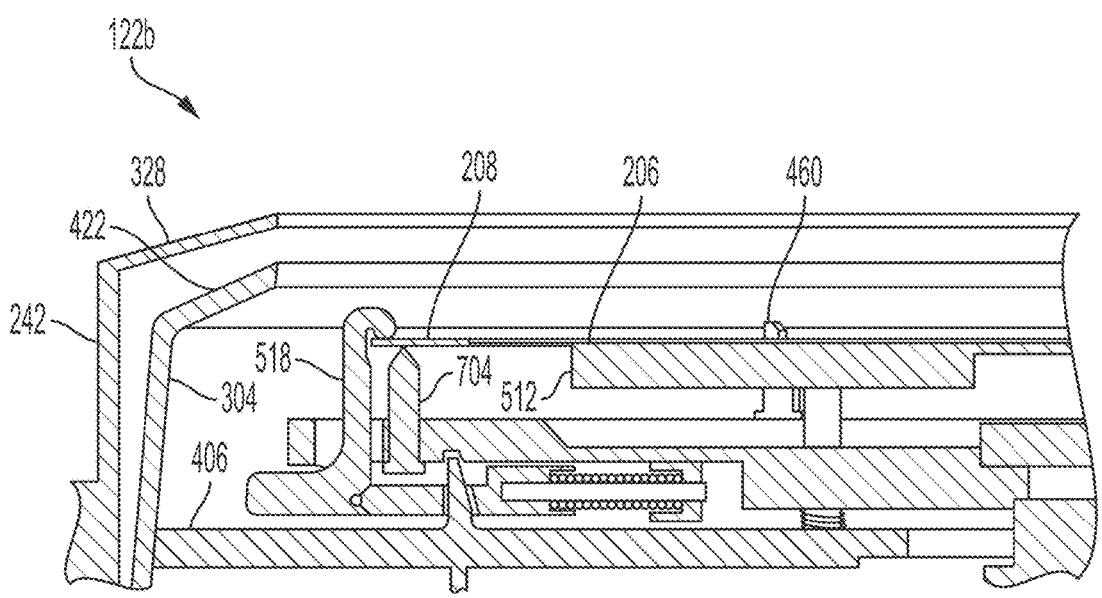
FIG. 8 depicts a cross-sectional view of a portion of a wet clean chamber in a front-side processing position in accordance with at least some embodiments of the present disclosure.

FIG. 7 depicts a cross-sectional view of a portion of a wet clean chamber 122b in a back-side processing position in accordance with at least some embodiments of the present disclosure. In the back-side processing position, the support plate 512 is spaced from the backing tape 206 so that a back-side of the second type of substrate 112b may be cleaned, for example, by backside fluid from the backside fluid source 320. FIG. 8 depicts a cross-sectional view of a portion of a wet clean chamber 122b in a front-side processing position in accordance with at least some embodiments of the present disclosure. In some embodiments, in the front-side processing position, the support plate 512 is in contact with and may push up the backing tape 206 to prevent sagging of the backing tape 206. In some embodiments, as depicted in FIG. 7, an upper surface 716 of the support plate 512 may be flat. In some embodiments, the upper surface 716 of the support plate 512 may be curved or dome shaped.

In some embodiments, the support plate 512 includes a plurality of support pins 704 configured to raise the tape frame substrate, or second type of substrate 112b, off of the support plate 512 and along a support plane 710. A top of the plurality of support pins 704 may be aligned with a support surface of the one or more support fingers 460. As depicted in FIGS. 7 and 8, the one or more hook fingers 518 are configured to clamp the second type of substrate 112b against the support pins 704.

In use, the motor 250 may be raised to lift the substrate support 248b in an upper, transfer position. In some embodiments, each of the one or more hook fingers 518 include a lower portion 732 that extends radially outward of the base plate 510. When in the transfer position, the outer wall 410 of the rotor 304 pushes against the lower portion 732, overcoming the biasing force of the spring mechanism 610, so that a head 720 of each of the one or more hook fingers 518 swings radially outward about a pivot 722. With the head 720 outward, a transfer robot (not shown) may place the second type of substrate 112b on the plurality of support pins 704. The motor 250 may then be used to lower the substrate support 248b. As the substrate support 248b lowers, the one or more hook fingers 518 will rotate and contact the top surface of the second type of substrate 112b to grip or clamp the second type of substrate 112b. In the upper position, the support plate 512 may rest on the base plate 510. In some embodiments, the support plate 512 rests within a recess 712 on an upper surface of the base plate 510.

Once the substrate support 248b is partially lowered, the support plate 512 will hard stop, for example, against an upper surface 718 of the annular base plate 406. As the substrate support 248b continues to lower, the support plate 512 no longer moves in the vertical direction, thus the backside of the second type of substrate 112b will come into contact with the support plate 512 to support the backing tape 206. The support plate 512 reduces or eliminates sag and provides a secure and stable surface. Spinning a tape frame substrate at high RPM without supporting a center could result is significant vibration of the tape plus chiplets, which would be unpredictable to clean and could result in die detachment, formation of particles, or significant splashing. After the wet clean process of the front-side of the second type of substrate 112b, the substrate support 248b can be raised partially such that the support plate 512 is no longer contacting the backing tape 206. The gap would allow for rinsing and drying of the back-side (back-side processing). In some embodiments, a front-side rinse could take place at the same time as back-side processing. In some embodiments, upon completion of front and back rinse, the rotor 304 would spin up to about 2000 RPM for high speed dry. Once processed, the second type of substrate 112b may be raised and removed from the wet clean chamber 122b.

Figure 9:
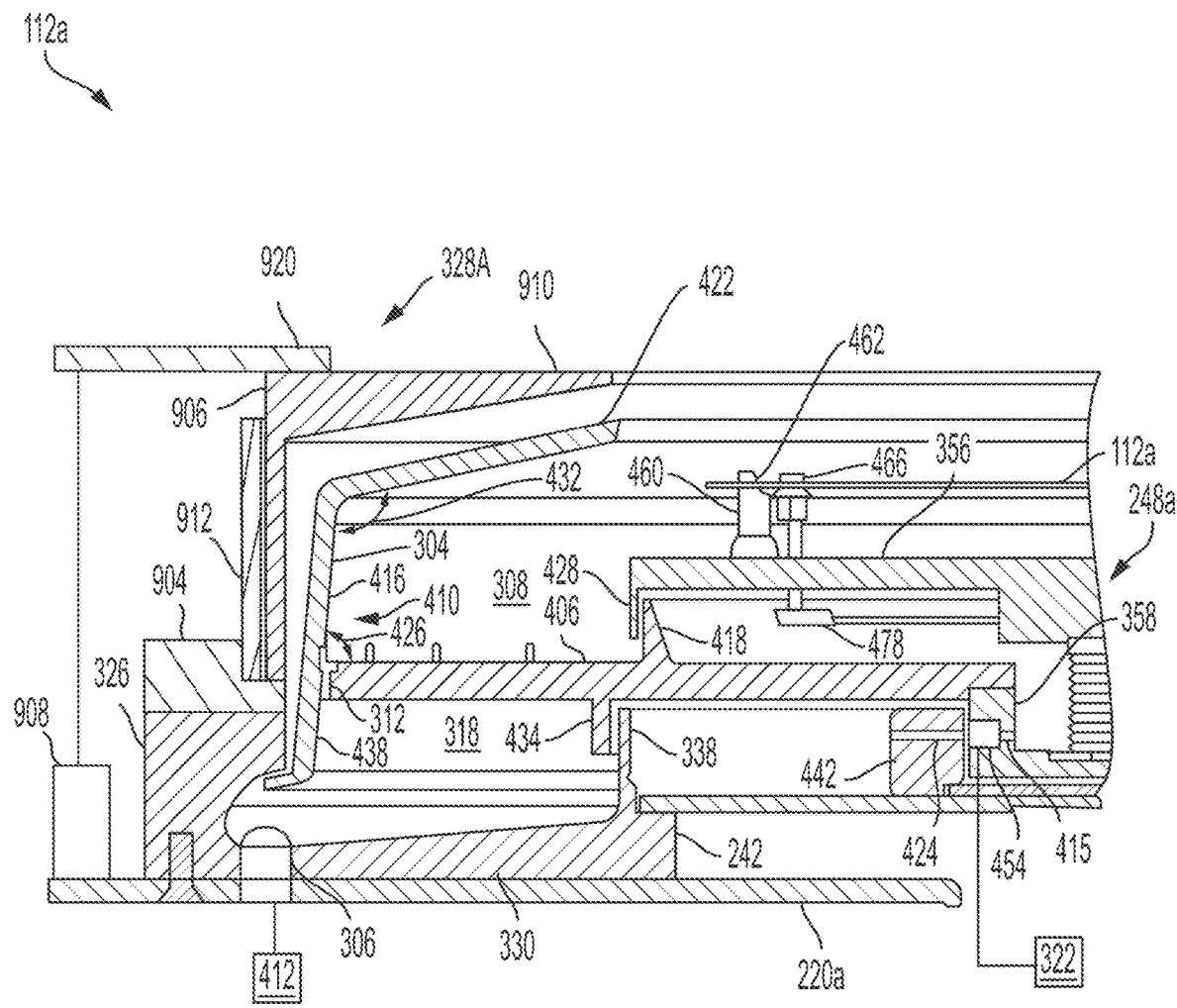
FIG. 9 depicts a schematic cross-sectional view of a portion of a wet clean chamber having an extendable cover in accordance with at least some embodiments of the present disclosure.

FIG. 9 depicts a schematic cross-sectional view of a portion of a wet clean chamber 122 having an extendable cover 328A in accordance with at least some embodiments of the present disclosure. The extendable cover 328A may advantageously be telescoping or expandable to further reduce or prevent splashing of processing fluids out of the "open" top of the wet clean chamber 122a or the second wet clean chamber 122b and may be implemented in any of the chambers discussed herein. In some implementations, the cover 328 includes an inner ring 906 and an outer ring 912, where one of the inner ring 906 or the outer ring 912 is configured to be raised with respect to the other of the inner ring 906 or the outer ring 912. For example, as depicted in FIG. 9, the inner ring 906 is disposed radially inward of the outer ring 912 and configured to be raised with respect to the outer ring 912 via one or more actuators 908. In some embodiments, the one or more actuators 908 are coupled to the deck plate 220a. FIG. 9 depicts the extendable cover 328A in the lower, or unexpanded, position. In the upper, or expanded position, the inner ring 906 is raised with respect to the outer ring 912 to provide additional vertical coverage.

In some embodiments, the inner ring 906 is coupled to one or more tabs 920 extending radially outward from the inner ring 906. The one or more tabs 920 are coupled to corresponding ones of the one or more actuators 908 to facilitate coupling the inner ring 906 to the one or more actuators 908. In some embodiments, the one or more tabs 920 may comprise or consist of four tabs. In some embodiments, the outer ring 912 is stationary and coupled to the body 326 via an adapter ring 904. In some embodiments, the inner ring 906 includes a cylindrical body and an upper portion 910 extending radially inward from the cylindrical body and corresponding with a shape of the second wall 422 of the rotor 304. In some embodiments, the upper portion 910 is wedge shaped. In some embodiments, the extendable cover 328A provides an additional 50 mm or more of vertical coverage.

While the foregoing is directed to embodiments of the present disclosure, other and further embodiments of the disclosure may be devised without departing from the basic scope thereof.

The invention claimed is:

1. A wet clean chamber, comprising:
   a deck plate;
   a substrate support that is rotatable and configured to support a substrate;
   a rotor disposed about and configured to rotate with the substrate support, wherein the rotor includes an upper fluid collection region disposed radially outward of the substrate support in position to collect fluid leaving the substrate support during processing, and wherein the upper fluid collection region includes a plurality of drain openings along a radially outward perimeter of a bottom of the upper fluid collection region, wherein the rotor includes an annular base plate and an outer wall having an upper portion extending upward and radially inward from an outer perimeter of the annular base plate and a lower portion extending downward and radially outward from the annular base plate, wherein the rotor includes a first annular lip extending upward from the annular base plate, and wherein the substrate support includes an outer annular lip that extends downward from a body of the substrate support and surrounds the first annular lip;
   a stationary housing surrounding the rotor and having a lower fluid collection region disposed beneath the drain openings of the rotor and having one or more exhaust ports fluidly coupled to the lower fluid collection region, wherein the lower fluid collection region is disposed above the deck plate; and
   one or more fluid delivery arms coupled to the deck plate and configured to deliver fluid to the substrate.

2. The wet clean chamber of claim 1, wherein the one or more fluid delivery arms comprise a first arm configured to deliver a first fluid and a second arm configured to deliver a second fluid, wherein the one or more fluid delivery arms are configured for rotational and vertical movement with respect to the deck plate.

3. A twin wet clean chamber, comprising:
the wet clean chamber of claim 1, wherein the substrate support is configured to support a wafer;
a second wet clean chamber, wherein the second wet clean chamber comprises:
a second deck plate;
a second substrate support that is rotatable and configured to support a second substrate comprising a tape frame substrate in a second support plane;
a second rotor disposed about and configured to rotate with the second substrate support, wherein the second rotor includes a second upper fluid collection region disposed radially outward of the second substrate support in position to collect fluid leaving the second substrate support during processing, and wherein the second upper fluid collection region includes a plurality of second drain openings along a radially outward perimeter of a bottom of the second upper fluid collection region;
a second stationary housing surrounding the second rotor and having a second lower fluid collection region disposed beneath the second drain openings of the second rotor; and
one or more second fluid delivery arms coupled to the second deck plate and configured to deliver fluid to the second substrate; and
a separation wall disposed between the wet clean chamber and the second wet clean chamber.

4. The wet clean chamber of claim 1, further comprising a gas purge line extending to a region between the substrate support and the rotor.

5. The wet clean chamber of claim 1, wherein the plurality of drain openings in the rotor comprise about 30 to about 90 openings.

6. A wet clean chamber, comprising:
a substrate support that is rotatable and configured to support a substrate in a support plane;
a rotor disposed about and configured to rotate with the substrate support, wherein the rotor includes an upper fluid collection region disposed radially outward of the substrate support in position to collect fluid leaving the substrate support during processing, wherein the rotor includes an annular base plate and an outer wall having an upper portion extending upward and radially inward from an outer perimeter of the annular base plate and a lower portion extending downward and radially outward from the annular base plate, wherein the upper fluid collection region includes a plurality of drain openings along a radially outward perimeter of a bottom of the upper fluid collection region, wherein the rotor includes a first annular lip extending upward from the annular base plate, and wherein the substrate support includes an outer annular lip that extends downward from a body of the substrate support and surrounds the first annular lip; and
a stationary housing surrounding the rotor and having a lower fluid collection region disposed beneath the drain openings of the rotor.

7. The wet clean chamber of claim 6, wherein a lower portion of the stationary housing and a lower surface of the annular base plate at least partially define the lower fluid collection region.

8. The wet clean chamber of claim 6, wherein the rotor includes a second annular lip extending downward from the annular base plate and surrounds an inner lip of the stationary housing.

9. The wet clean chamber of claim 6, wherein the upper portion of the outer wall comprises a first annular wall extending upward and radially inward at a first angle and a second annular wall extending upward and radially inward from the first annular wall at a second angle greater than the first angle.

10. The wet clean chamber of claim 6, wherein the substrate support includes one or more substrate holders that include one or more fingers having a beveled surface to support an outer surface of the substrate and a lower outer surface of the substrate.

11. The wet clean chamber of claim 6, wherein the substrate is a tape frame substrate and the substrate support comprises a base plate and a support plate disposed over the base plate and configured to be raised with respect to the base plate.

12. The wet clean chamber of claim 11, wherein the support plate includes a plurality of support pins configured to raise the tape frame substrate off of the support plate and one or more hook fingers configured to clamp the tape frame substrate against the support pins.

13. The wet clean chamber of claim 6, wherein the stationary housing includes a body and a cover extending upward and radially inward from the body.

14. The wet clean chamber of claim 13, wherein the cover comprises an extendable cover.

15. A multi-chamber processing tool, comprising:
a factory interface having one or more loadports;
a transfer chamber coupled to the factory interface; and
a wet clean chamber coupled to the transfer chamber, the wet clean chamber, comprising:
a substrate support that is rotatable and configured to support a substrate in a support plane;
a rotor disposed about and configured to rotate with the substrate support, wherein the rotor includes an upper fluid collection region disposed radially outward of the substrate support in position to collect fluid leaving the substrate support during processing, and wherein the upper fluid collection region includes a plurality of drain openings, wherein the rotor includes an annular base plate and an outer wall having an upper portion extending upward and radially inward from an outer perimeter of the annular base plate and a lower portion extending downward and radially outward from the annular base plate, wherein the rotor includes a first annular lip extending upward from the annular base plate, and wherein the substrate support includes an outer annular lip that extends downward from a body of the substrate support and surrounds the first annular lip; and
a stationary housing surrounding the rotor and having a lower fluid collection region disposed beneath the drain openings of the rotor, wherein the stationary housing includes a cover extending upward and radially inward from a body of the stationary housing, and wherein the rotor includes a first outer wall and a second outer wall extending upward and radially inward from the first outer wall, wherein the second outer wall extends substantially parallel to the cover.

16. The multi-chamber processing tool of claim 15, wherein the one or more loadports comprises one or more loadports for receiving a wafer and one or more loadports for receiving a tape frame substrate.

17. The multi-chamber processing tool of claim 15, wherein the substrate is a tape frame substrate and the substrate support comprises a base plate and a support plate disposed over the base plate and configured to be raised with respect to the base plate to selectively contact the tape frame substrate.

18. The multi-chamber processing tool of claim 15, wherein an upper portion of the stationary housing corresponds with a shape of an upper portion of the rotor.

19. The multi-chamber processing tool of claim 15, wherein the substrate support is configured to support a wafer, and the substrate support includes an outer annular lip that extends downward from an outer edge of the substrate support.

* * * * *